(12) United States Patent
Rothkopf et al.

(10) Patent No.: US 8,477,492 B2
(45) Date of Patent: Jul. 2, 2013

(54) FORMED PCB

(75) Inventors: Fletcher R. Rothkopf, Los Altos, CA (US); Phillip M. Hobson, Menlo Park, CA (US); Adam Mittleman, San Francisco, CA (US); Anna-Katrina Shedletsky, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 302 days.

(21) Appl. No.: 12/859,712

(22) Filed: Aug. 19, 2010

(65) Prior Publication Data

US 2012/0044637 A1 Feb. 23, 2012

(51) Int. Cl.
*H05K 7/00* (2006.01)
*G06F 1/16* (2006.01)

(52) U.S. Cl.
USPC .......... 361/679.55; 361/679.02; 361/748; 361/749; 361/752

(58) Field of Classification Search
USPC .......... 361/749, 752, 760, 761, 784, 796, 361/679.01, 679.02, 679.55, 679.56, 748; 174/250, 254
See application file for complete search history.

(56) References Cited

U.S. PATENT DOCUMENTS

| | | | |
|---|---|---|---|
| 4,074,419 A | 2/1978 | Hanni et al. | |
| 5,045,971 A | 9/1991 | Ono et al. | |
| 5,128,829 A | 7/1992 | Loew | |
| 5,180,644 A | 1/1993 | Bresin et al. | |
| 5,468,947 A | 11/1995 | Danielson et al. | |
| 5,568,358 A | 10/1996 | Nelson et al. | |
| 5,737,183 A | 4/1998 | Kobayashi et al. | |
| 5,784,256 A | 7/1998 | Nakamura et al. | |
| 5,796,575 A | 8/1998 | Podwalny et al. | |
| 6,038,328 A | 3/2000 | Hsu | |
| 6,137,890 A | 10/2000 | Markow | |
| 6,144,368 A | 11/2000 | Ooka et al. | |
| 6,153,834 A | 11/2000 | Cole et al. | |
| 6,398,560 B1 * | 6/2002 | Mizuno | 439/67 |
| 6,408,171 B1 | 6/2002 | Schuelke et al. | |

(Continued)

FOREIGN PATENT DOCUMENTS

| | | |
|---|---|---|
| CN | 2757458 | 2/2002 |
| CN | 1361970 | 7/2002 |

(Continued)

OTHER PUBLICATIONS

Office Action dated Oct. 25, 2010 in CN Application No. 201020179389.8.

(Continued)

*Primary Examiner* — Angel R Estrada
*Assistant Examiner* — Dimary Lopez
(74) *Attorney, Agent, or Firm* — Jennifer Luh

(57) ABSTRACT

Methods for forming PCBs that can be used in a portable computing device are described. The PCBs can be installed in the portable computing device in a bent configuration. In a particular embodiment, a contiguously formed PCB can be shaped with two large regions connected a thin connector portion. The thin connector portion can connect components one each of the two large regions and can be used in lieu of a flex connector. In one embodiment, the PCB can be formed from multiple layers including trace and substrate layers. The trace and substrate layer can be adjusted to affect the stiffness of the PCB in various regions, such as to allow the PCB to hold a bent configuration after a bending moment is applied.

21 Claims, 7 Drawing Sheets

U.S. PATENT DOCUMENTS

| | | |
|---|---|---|
| 6,427,017 B1 | 7/2002 | Toki |
| 6,452,811 B1 | 9/2002 | Tracy et al. |
| 6,536,589 B2 | 3/2003 | Chang |
| 6,746,797 B2 | 6/2004 | Benson et al. |
| 6,757,157 B2 | 6/2004 | Lammintaus et al. |
| 6,781,824 B2 | 8/2004 | Krieger et al. |
| 6,819,946 B2 | 11/2004 | Hansson |
| 6,838,810 B1 | 1/2005 | Bovio et al. |
| 6,847,522 B2 | 1/2005 | Fan et al. |
| 6,929,879 B2 | 8/2005 | Yamazaki |
| 7,149,557 B2 | 12/2006 | Chadha |
| 7,190,802 B2 | 3/2007 | Rains et al. |
| 7,236,357 B2 | 6/2007 | Chen |
| 7,297,439 B2 | 11/2007 | Yamazaki et al. |
| 7,352,584 B1 | 4/2008 | Sung |
| 7,412,267 B2 | 8/2008 | Eaton et al. |
| 7,432,860 B2 | 10/2008 | Huynh |
| 7,479,345 B2 * | 1/2009 | Nakamura .................... 429/129 |
| 7,515,431 B1 | 4/2009 | Zadesky et al. |
| 7,553,055 B2 | 6/2009 | Liu |
| 7,558,054 B1 | 7/2009 | Prest et al. |
| 7,558,057 B1 | 7/2009 | Naksen et al. |
| 7,558,396 B2 | 7/2009 | Liu et al. |
| 7,564,424 B2 | 7/2009 | Umehara |
| 7,583,987 B2 | 9/2009 | Park |
| 7,620,175 B2 | 11/2009 | Black et al. |
| 7,663,607 B2 | 2/2010 | Hotelling et al. |
| 7,668,332 B2 | 2/2010 | Williams et al. |
| 7,688,574 B2 | 3/2010 | Zadesky et al. |
| 7,697,281 B2 | 4/2010 | Dabov et al. |
| 7,756,553 B2 * | 7/2010 | Dinh et al. ................. 455/575.1 |
| 7,936,565 B2 * | 5/2011 | Muro et al. ................... 361/749 |
| 7,998,065 B2 * | 8/2011 | Avni ............................. 600/130 |
| 2002/0102870 A1 | 8/2002 | Burns et al. |
| 2002/0107044 A1 | 8/2002 | Kuwata et al. |
| 2002/0114143 A1 | 8/2002 | Morrison et al. |
| 2003/0003945 A1 | 1/2003 | Saiki et al. |
| 2003/0081392 A1 | 5/2003 | Cady et al. |
| 2004/0084244 A1 | 5/2004 | Zurek et al. |
| 2004/0203518 A1 | 10/2004 | Zheng et al. |
| 2005/0014537 A1 | 1/2005 | Gammon et al. |
| 2005/0088778 A1 | 4/2005 | Chen et al. |
| 2005/0095745 A1 | 5/2005 | Sapir |
| 2006/0067070 A1 | 3/2006 | Otsuki |
| 2006/0157842 A1 | 7/2006 | Goodwin |
| 2006/0262500 A1 | 11/2006 | Huang et al. |
| 2007/0058821 A1 | 3/2007 | Welsh et al. |
| 2007/0081303 A1 | 4/2007 | Lam et al. |
| 2007/0160228 A1 | 7/2007 | Yang et al. |
| 2008/0025547 A1 | 1/2008 | Yun et al. |
| 2008/0037765 A1 | 2/2008 | Finney et al. |
| 2008/0037770 A1 | 2/2008 | Emmert |
| 2008/0062660 A1 | 3/2008 | Weber et al. |
| 2008/0069384 A1 | 3/2008 | Kim et al. |
| 2008/0101026 A1 | 5/2008 | Ali |
| 2008/0165139 A1 | 7/2008 | Hotelling et al. |
| 2008/0165485 A1 | 7/2008 | Zadesky et al. |
| 2008/0266774 A1 | 10/2008 | Tracy et al. |
| 2008/0316116 A1 | 12/2008 | Hobson et al. |
| 2008/0316121 A1 | 12/2008 | Hobson et al. |
| 2009/0015510 A1 | 1/2009 | Nakata et al. |
| 2009/0049773 A1 | 2/2009 | Zadesky et al. |
| 2009/0059485 A1 | 3/2009 | Lynch et al. |
| 2009/0067141 A1 | 3/2009 | Dabov et al. |
| 2009/0155681 A1 | 6/2009 | Lin et al. |
| 2009/0160712 A1 | 6/2009 | Breiter et al. |
| 2009/0185045 A1 | 7/2009 | Rosenblatt et al. |
| 2009/0201652 A1 | 8/2009 | Chew et al. |
| 2009/0245564 A1 | 10/2009 | Mittleman et al. |
| 2009/0257189 A1 | 10/2009 | Wang et al. |
| 2009/0257613 A1 | 10/2009 | Khamashta et al. |
| 2009/0302804 A1 | 12/2009 | Park et al. |
| 2010/0008040 A1 | 1/2010 | Weber et al. |
| 2010/0073247 A1 | 3/2010 | Arkko et al. |

FOREIGN PATENT DOCUMENTS

| | | |
|---|---|---|
| CN | 2779773 | 5/2006 |
| CN | 1870676 | 11/2006 |
| DE | 10252308 | 4/2004 |
| EP | 0534290 | 3/1993 |
| EP | 1209880 | 2/2002 |
| EP | 1257147 | 11/2002 |
| EP | 1441489 | 7/2004 |
| EP | 1 732 230 A2 | 12/2006 |
| EP | 1870956 | 12/2007 |
| EP | 2343872 | 7/2011 |
| GB | 2137425 | 10/1984 |
| JP | 2003-11194 | 4/2003 |
| JP | 2004-213498 | 7/2004 |
| JP | 2005130156 A | 5/2005 |
| KR | 20070047650 A | 5/2007 |
| WO | WO 2008/152438 | 12/2008 |
| WO | WO 2009/056143 | 5/2009 |

OTHER PUBLICATIONS

Notice of Allowance dated Sep. 3, 2010 in U.S. Appl. No. 12/205,826.
Office Action dated Jul. 12, 2010 in U.S. Appl. No. 12/205,826.
U.S. Appl. No. 12/950,793, filed Nov. 19, 2010.
U.S. Appl. No. 61/377,866, filed Aug. 27, 2010.
Office Action dated Sep. 30, 2009 in U.S. Appl. No. 12/205,824.
Notice of Allowance dated Dec. 21, 2009 in U.S. Appl. No. 12/205,824.
U.S. Appl. No. 12/859,694, filed Aug. 19, 2010.
U.S. Appl. No. 12/859,702, filed Aug. 19, 2010.
U.S. Appl. No. 12/859,711, filed Aug. 19, 2010.
U.S. Appl. No. 12/859,701, filed Aug. 19, 2010.
Evaluation Report for Utility Model Patent ZL2009201775365 dated May 28, 2010.
Canadian Office Action for 2,735,999 dated Sep. 12, 2011.
Japanese Office Action for 2011-526076 dated Sep. 9, 2011.
Australian Examiner's First Report for 2011203145dated Aug. 25, 2011.
Chinese Office Action for 201020179389.8 dated Feb. 16, 2011.
International Search Report for PCT/US2009/050879 dated Dec. 27, 2010.
Written Opinion for PCT/US2009/050879 dated Dec. 27, 2010.
European Office Action for 09790546.7 dated Dec. 21, 2011.
Office Action for U.S. Appl. No. 12/712,900 dated Jan. 5, 2012.
Written Opinion for PCT/US2011/048404 dated Feb. 13, 2012.
Notice of Allowance for U.S. Appl. No. 12/712,900 dated Apr. 25, 2012.
International Preliminary Report on Patentability for PCT/US2009/080879 dated Mar. 8, 2011.
Partial Search Report for PCT/US2009/050879 dated Oct. 7, 2010.
International Search Report for PCT/US2011/048404 dated Feb. 13, 2012.
Korean Office Action for KR 10-2011-7021855 dated Feb. 6, 2012.
Japanese Final Office Action for 2011-526076 dated Feb. 22, 2012.
Ho et al., "Cost Effective Integrated Housing and Printed Circuit Module for Battery Pack," ip.com Prior Art Database, Apr. 29, 2004, 6 pgs.

* cited by examiner

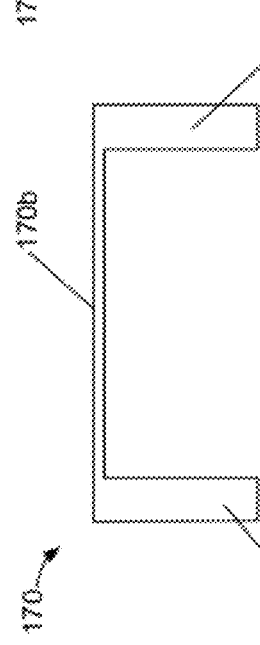
Figure 4A
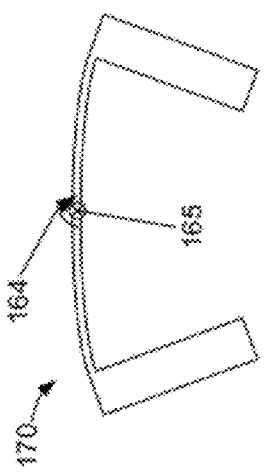
Figure 4B
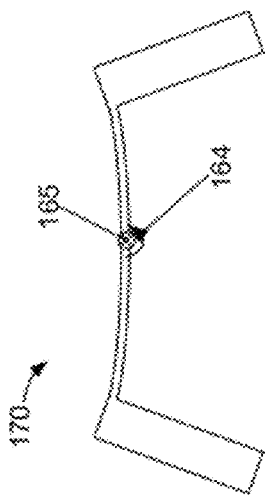
Figure 4C
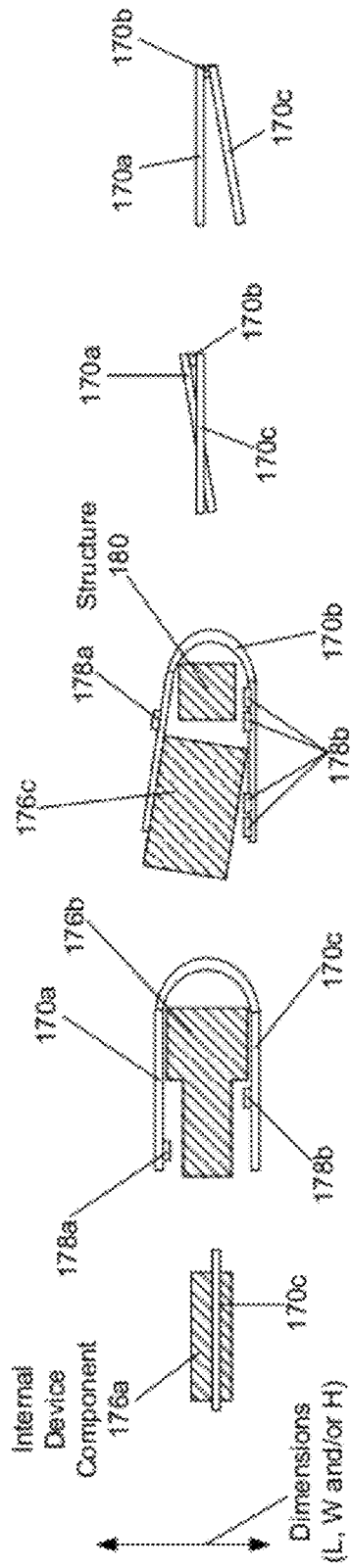
Figure 5A
Figure 5B
Figure 5C
Figure 5D
Figure 5E

FORMED PCB

BACKGROUND

1. Field of the Described Embodiments

The described embodiments relate generally to computing devices such as laptop computers, tablet computers, and the like. More particularly, internal packaging architectures involving printed circuit board design are described.

2. Description of the Related Art

In recent years, portable computing devices such as laptops, PDAs, media players, cellular phones, etc., have become small, light and powerful. One factor contributing to this reduction in size can be attributed to the manufacturer's ability to fabricate various components of these devices in smaller and smaller sizes while in most cases increasing the power and or operating speed of such components. Another factor contributing to the reduction in size is that from a visual stand point, users often find compact and sleek designs of consumer electronic devices more aesthetically appealing and thus, demand compact and sleek designs. The trend of smaller, lighter, more compact and powerful presents continuing challenges in the design portable computing devices and its associated components.

One design discipline that enables small and compact devices is the area internal packaging. A particular device will have a desired form factor and functionality. The desired form factor determines a size of the housing in which all of the device components that provide the desired functionality are packaged. The internal packing design involves minimizing any unused dead-space that does not contribute in some way to the functioning of the device while still fitting the needed components in an allotted space dictated by the form factor. Extra space resulting from an efficient packaging design can be used to enable other design goals, such as 1) making the enclosure thinner, 2) making the enclosure or other components stronger and more shock resistant, 3) increasing a battery size which can lead to an improved device performance or 4) addressing thermal issues.

Typically, a portable computing device includes of number of components, such as a display, display controller and a battery, that are a larger than the other internal components. The display, display controller and the battery are usually constrained to a limited range of form factors necessitated by a needed shape necessary to provide its intended function as well as manufacturing considerations. Thus, in the packaging design, these components are often placed and secured within the enclosure in some manner and then the remaining components needed to provide the portable devices intended functionality are arranged to fit around them in some manner. When the display, display controller and battery are arranged and secured in the housing, a number of irregularly shaped spaces can remain that are not easily utilized, which can lead to unused dead-space within the device. In view of the foregoing, there is a need for improved internal component designs that enable more efficient utilization of the irregularly shaped internal spaces that result when the larger components of compact portable electronic device are packaged.

SUMMARY OF THE DESCRIBED EMBODIMENTS

Broadly speaking, the embodiments disclosed herein describe printed circuit board (PCB) well suited for use in consumer electronic devices, such as laptops, cellphones, netbook computers, portable media players and tablet computers. In particular, PCB designs are described that address packaging issues that can result when a light-weight consumer electronic device with a thin and compact enclosure is used. Methods for designing and forming the PCBs and illustrative embodiments of PCBs are described.

In one embodiment, the consumer electronic device can be a thin portable electronic device with a display. The internal arrangement of the components of the thin portable electronic device within its enclosure can be viewed as a number of stacked layers where the display including its display driver circuitry and the battery occupy some of the stacked layers. The remaining components, such as but not limited to a CPU, memory, audio components, a wireless interface, data connectors, power connectors and associated circuitry can be arranged to fit in unoccupied layers adjacent to the display, display circuitry and the battery or in portions of layers occupied but not totally utilized by these components. In particular, PCB designs are described that can allow various electrical components to be fitted and connected to one another in the odd spaces that can result in the device enclosure after the larger devices components are placed and secured within the enclosure.

In a particular embodiment, a relatively thin multi-layered PCB for use in a portable computing device can be provided. The multi-layered PCB can be formed in a planar configuration. During assembly of the portable computing device, the PCB can be bent in certain regions to allow it to be installed in a non-planar configuration. The bending capabilities can be used more efficiently fit the PCB within available spaces remaining in the enclosure after larger components, such as the battery are installed.

The multi-layered PCB can include a number of substrate layers and a number of trace layers wherein each trace layer is formed on top of a substrate layer. To form a trace layer, a solid layer of a conductive material, such as copper, can be deposited on top of a substrate layer and then portions of the solid layer can be removed to form conductive traces. For a PCB installed in a non-planar configuration, in regions where more bending forces are anticipated, the conductive traces can be made thicker. The conductive traces can be used to join components electrically coupled to the PCB. The components can be located on a top and/or bottom side of the PCB to fit in an available space or connect to other internal components as needed.

The stiffness of the multi-layered PCB can be locally adjusted to allow the board to be more amenable to bending in particular regions and more resistant to bending in other areas. Typically, a trace layer only includes traces used to join the components coupled to the PCB board where the excess material not used to form traces is removed. In one or more of the trace layers excess material can be used to change the stiffness properties of the PCB. For instance, excess trace material can be preserved in some trace layer areas to increase the overall stiffness of the PCB proximate to these areas and removed in other areas to increase the flexibility of the PCB.

In particular embodiments, one of the trace layers can be dedicated solely to adjusting the stiffness properties of the PCB. The material of the trace layer can be selected primarily for its stiffness properties rather than for its conductive properties. In this layer, portions of the layer can be removed to decrease the stiffness of the PCB and increase the flexibility of the PCB proximate to where the material is removed. In one embodiment, a shape memory alloy, such as nitonol, can be used.

In one embodiment, a main logic board can be formed from the multi-layered PCB. The main logic board can include a first rectangular portion joined to a second rectangular portion via a narrow connecting portion. Components such as a processor, a memory and an audio codec can be coupled to the main logic board. The main logic board can be shaped to fit in spaces above and below a top and bottom portion of the battery and along a side of the battery that remain after the battery is installed in an enclosure of the portable computing device. The main logic board can be installed in a planar or a non-planar configuration.

BRIEF DESCRIPTION OF THE DRAWINGS

The embodiments will be readily understood by the following detailed description in conjunction with the accompanying drawings, wherein like reference numerals designate like structural elements, and in which:

FIGS. 4A-4C show top views of a bendable PCB in various bend configurations.

FIGS. 5A-5E show side views of a bendable PCB in various bend configurations.

DESCRIBED EMBODIMENTS

Figure 1A:
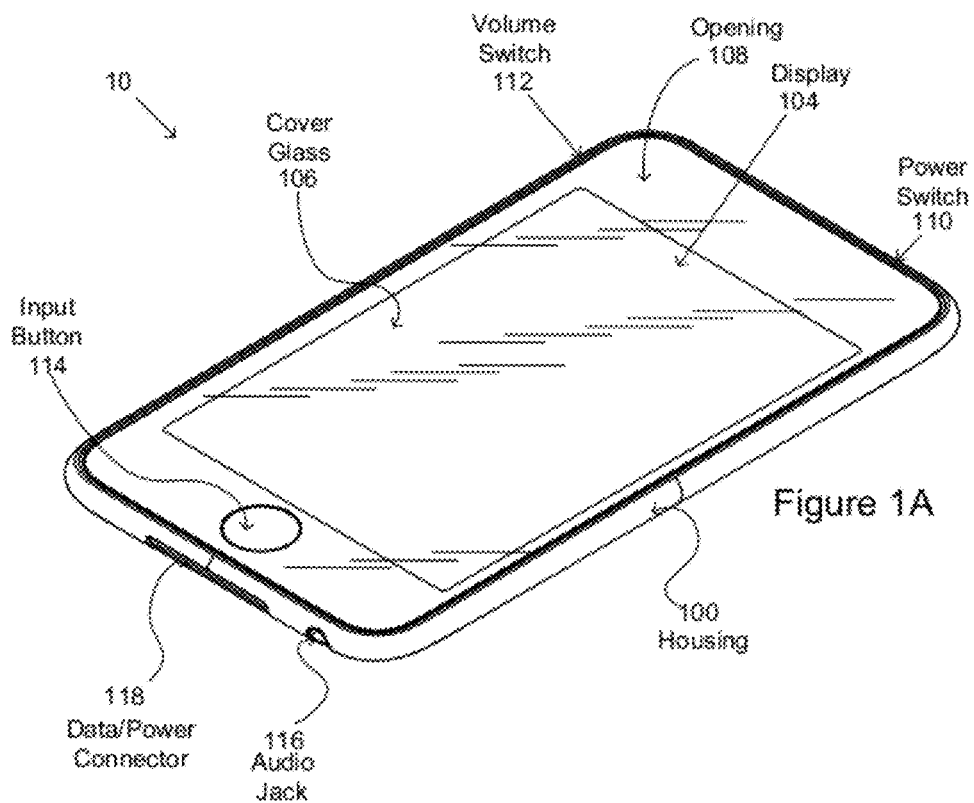
FIGS. 1A and 1B show a perspective view of a portable computing device and a block diagram of the portable computing device in accordance with the described embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

A first factor that can be considered in the packaging of a portable computing device with a display and a desired thin profile is the placement of the larger components, such as a display, a display circuitry and a battery within the housing. In addition, a placement of the support and/or attachments structures needed to secure the larger device components to the housing can be considered. The larger device components and their associated support structure can be positioned with the consideration that sufficient room needs to be provided to allow various input/output mechanisms, such as volume switches, power buttons, data and power connectors, audio jacks to be arranged around the outer edges of the housing. In the remaining spaces not occupied by the larger components, other internal components, such as but not limited to a processor and memory, speakers, a microphone, a camera and their associated circuitry boards as well as various connectors that allow all the device components to be controlled and operated for their intended functions, can be placed.

The remaining spaces not occupied by the larger components can be irregularly shaped and distributed at various positions and height levels throughout the enclosure. Custom shaped components can be designed to fit within these spaces. Then, the components can be linked to one another in some manner. For instance, to allow the portable device to provide its intended functionality, many of the components can communicate with a controller board, such as a main logic board, to receive operating instructions. As another example, many of the components require power, which can be supplied from an internal battery via various power connections. Typically, the space between components can be used to route data and/or power connections. Thus, room for needed power and data connections can be considered in the packaging design of the device.

One solution for connecting various electrical components internally distributed within the housing is to use flexible connectors (Flexible connectors are often call "flex" connectors). One disadvantage of flex connectors is an increase in manufacturing steps. Each time one internal component is connected to another internal component by a flex connector two manufacturing steps are added. One of the steps can be eliminated in the assembly process by connecting the flex to one of the components during its manufacture. Nevertheless, during assembly, typically at least one end of the flex connector needs to be connected to an associated internal component.

Another disadvantage of flex connectors is that the connection points where the flex is connected to a component can be susceptible to failure during the operation of the device. For instance, flex connection points can be susceptible to failures resulting from shocks, such as when a device is dropped, than other types of connections. In addition, during assembly, a flex connection point can be improperly formed which can lead to premature or unanticipated failure of the device. Thus, the use of flex connectors can introduce additional instances where a manufacturing error can occur that reduces the overall reliability of the device.

As is described in detail herein, to eliminate flex connectors and yet accommodate the packaging environment associated thin and compact portable electronic device, bendable and contiguously formed PCBs can be used. As an example, a single contiguous PCB can include two large portions, such as two rectangular shaped portions, connected by a portion of the PCB that is much thinner the two rectangular portions. The two large portions of the PCB can be formed as two separate PCBs and then joined by a flex connector. Instead, a contiguous PCB board can be formed where connector portion of the PCB can be used in lieu of the flex connector. The relative thinness of the connector portion can allow it to be easily bent.

The larger portions of the PCB can be custom shaped (e.g., non-rectangular) and sized to fit into spaces that are available internally within the housing. A length and shape of the connector portion of the PCB can be determined based upon the internal pathways that exist between the spaces where the larger portions of the PCB are placed. In one embodiment, the connector portion of the PCB can be bent at various locations to fit into the internal pathways that can be available between larger portions of the PCB. In other embodiments, the larger portions of the PCB can also be bent to allow them to be fit in an available internal space.

The profile of a portable computing device, the components that need to be connected and the positioning of the various components can affect the available spaces within the housing that the bendable PCBs described herein can be shaped to fit and the circuitry that can reside on the bendable PCBs. Thus, a perspective view of a portable computing device with an illustrative profile and a block diagram of the components of the portable computing device are described with respect to FIGS. 1A and 1B. In one embodiment, a bendable PCB can be formed as a main logic board. Thus, with respect to FIGS. 2A, 2B and 2C, a bendable main logic board including an illustrative placement of the board within a housing of a portable computing device is described. Other configurations and placement of a bendable PCB are discussed with respect to FIGS. 3A, 3B and 3C. With respect to FIGS. 4A-5E, a number of configurations for a bendable PCB are illustrated. The stiffness properties of a bendable PCB can be adjusted by manipulating the formation of one or more the trace layers in the PCB. The formation and manipulation of these layers is described with respect to FIGS. 6A-6B. A method of manufacturing a portable computing device utilizing a bendable PCB is discussed with respect to FIG. 7. Finally, a block diagram of portable computing device with media playing capabilities is described with respect to FIG. 8.

FIG. 1A shows a perspective view of a portable computing device 10 with a relatively thin profile in accordance with the described embodiments. The portable computing device 10 can include a housing 100 with an opening 108. A display 104 surrounded by a frame can be positioned within the opening 108. Display circuitry for the display 104 can be located within the housing 100, such as directly below the display 104. As described above, the positioning of the display circuitry can affect the internal spaces that are available within the housing 100.

A touch screen can be associated with the display 104. Circuitry associated with the touch screen, such as touch screen controller, can be located within the housing 100. The display 104 can be sealed via a cover glass 106. An input button 114 can be positioned in an opening the glass cover 106. Detection circuitry associated with the input button 114 can be located within the housing 100. In one embodiment, the input button can be used to return the device 10 to a particular state, such as a home state.

A number of input/output mechanisms can be located around the edges of the housing. For instance, a data/power connector 118 and audio jack 116 can be located on a bottom edge of the housing 100 and a power switch 110 can be located on a top edge of the housing 100. The housing 100 can also include openings for speakers and/or microphones. Circuitry supporting these components can be packaged internally within the housing 100. The circuitry can be embodied on various circuit boards, such as bendable PCBs described herein, disposed within the housing.

Figure 1B:
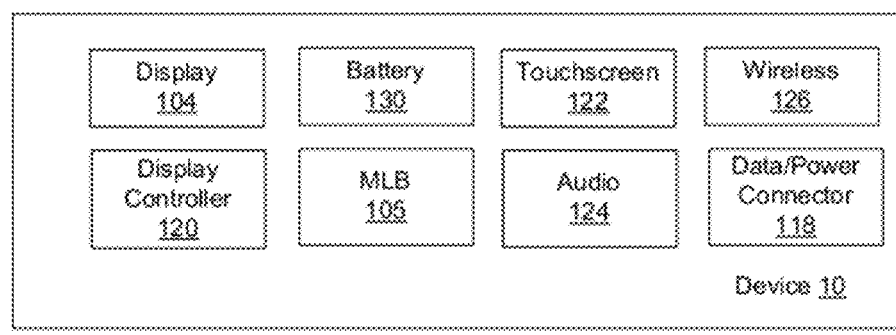

A block diagram of the device 10 is shown in FIG. 1B. The components described above are typically controlled by a processor on a main logic board (MLB) 105. Thus, various internal connections can be provided that allows data to move between the MLB 105 and the various components. The routing of the internal data connections can depend on how the various components are packaged including where the MLB 105 is positioned within the housing 100 and available internal pathways that result after the positioning of the various internal device components.

In regards to data connections, the MLB 105 can be connected to a display controller 120 which is coupled to the display 104. Further, the MLB 105 can be coupled to audio components, such as a speaker, the audio jack 116, a microphone or associated audio support circuitry including an audio codec. Further, the MLB 105 can be coupled to the various input devices, such as the touch screen 122, the volume switch circuitry, the input button circuitry and the power switch circuitry. In addition, the MLB 105 can be connected to various data interfaces that allow it to receive and send external data, such as the wireless interface 126, which can include an antenna, and the data/power connector 118.

Besides data connections, many internal device components can receive power from an internal power source, such as battery 130. For instance, the battery 130 can be coupled to the MLB 105, the display 104, the display controller 120, the touchscreen 122 and the data/power connector 118. Like the data connections, the routing of the power connections can depend on the positioning of the various internal device components, such as the battery 130 and the available internal pathways within the housing 100.

With respect to the following figures, embodiments of bendable PCBs are described. In one embodiment, the bendable PCBs can include portions of various sizes that are shaped to fit within internally available spaces distributed throughout the housing. The larger sized portions of the PCB can be joined by thin connector portions that are shaped to fit within the internal pathways that are available between the larger portions. The larger portions and the connector portions can be formed as a contiguous PCB. In a particular embodiment, a main logic board can be formed from a bendable PCB as is illustrated in the following figures.

Figure 2A:
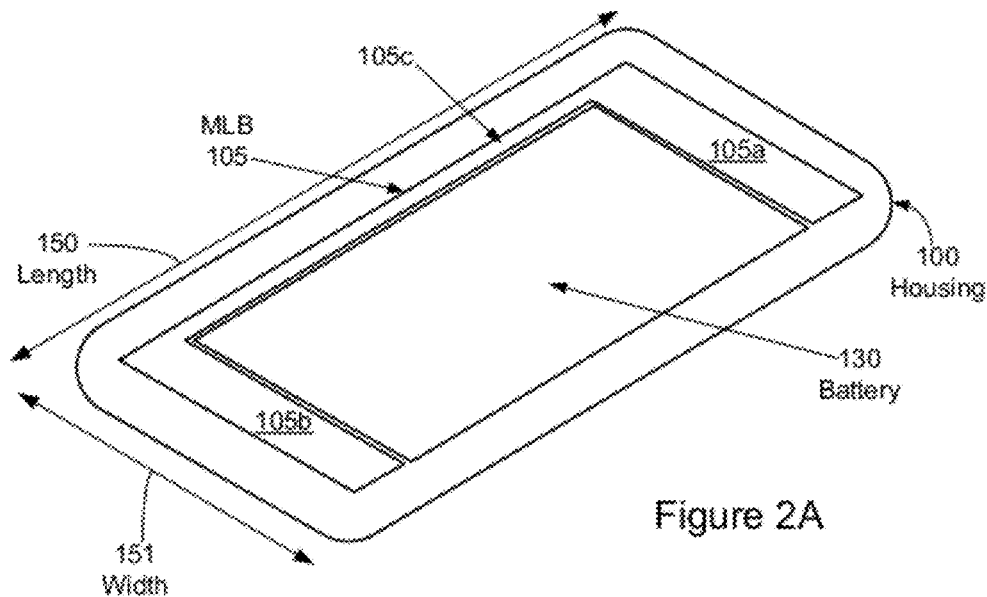
FIGS. 2A, 2B and 2C show a perspective view and side views of a bendable main logic board in accordance with the described embodiments.
Figure 2B:
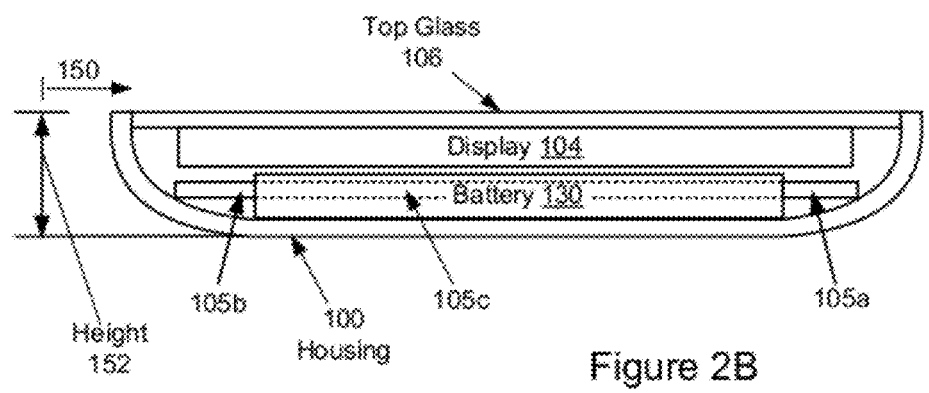
Figure 2C:
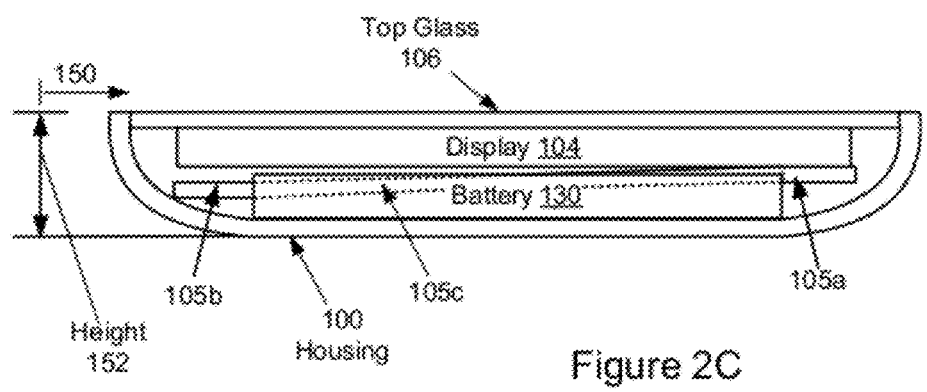

FIGS. 2A, 2B and 2C show a perspective view and side views of a bendable MLB 105 in accordance with the described embodiments. In FIG. 2A, a cross section of housing 100 is shown. The cross section of the housing 100 includes a length 150 and a width 151. The length 150 and width 151 can vary for different cross sections depending on the internal surface profile of the housing 100.

A battery 130 can be positioned within a center portion of the housing. In one embodiment, the battery 130 can be positioned and sized such that an internal space is available proximate to a top end of the battery, an internal space is available proximate to a bottom end of the battery and internal space is available along a side of the battery. A MLB 105 is shaped such that a first portion 105a can fit in the internal space proximate to the top end of the battery and a second portion 105b can fit in the internal space proximate to the bottom end of the battery. A connector portion 105c can join the first portion 105a and the second portion 105b. The connector portion 105c is thinner and longer than the first and second portions, 105a and 105b. The connector portion 105c is shown routed along an internal pathway on a side of the battery 130.

The shapes and positions of the first portion 105a, the second portion 105b and the connector portion 105c are provided for the purposes of illustration only and are not meant to be limiting. In various embodiments, the first portion 105a and the second portion 105b of MLB 150 can be larger or smaller in size than is shown in the figures. Further, the first portion 105a can have a different shape and size than the second portion 105b. Also, the shape of each portion, such as 105a and 105b, can be non-rectangular and include curved surfaces if desired. In addition, a PCB, such as MLB 105, can include two or more larger portions. For instance, a bendable PCB, such as MLB 105, can include three large portions that are joined by two connector portions.

In various embodiments, the connector portion 105c can be attached to the larger portions, 105a and 105b, at different locations. For example, the connector portion 105c can be attached to the portions 105a and 105b near their center to form more an "I" shape. In this example, the connector 105c can be routed over a top or a bottom of the battery 132 if there is an internal pathway available or the casing of the battery 132 can include a groove on its top surface or bottom surface that can be used as a pathway for connector 105c.

The connector 105c does not have to be formed as a straight line. For example, the connector 105c can be formed to follow a curve path or follow a number of straight line segments at different angles to one another (e.g., a stepped or a zigzag path). In another example, the connector 105c can include one or more branches. The branches can be connected to other circuitry, such as additional PCBs. As is described in more detail with respect to FIGS. 2C and 4B-5E, after the connector 105c is formed, it can be bent or twisted into various configurations to follow a particular internal pathway. For instance, as is described in more detail with respect to FIG. 2C, it can be bent to traverse different heights within the device.

FIG. 2B shows a cross section perpendicular to the cross section in FIG. 2A with at a constant width value. The MLB 105 can be positioned at a height 152 below the top of the battery 130. The first and second portions of the MLB, 105a and 105b, can be sized to fit in the available space between the top side of the battery 130 and the bottom side of the battery 130. The connector portion 105c can traverse a side connecting the bottom side and top side of the battery and is indicated by the dashed lines.

In one embodiment, as is shown in FIG. 2B, the MLB 105 can be installed in a planar configuration with a relatively constant height across the PCB i.e., 105a, 105b and 105c are installed at similar height. In other embodiments, the MLB can be installed in a non-planar configuration. For example, in FIG. 2C, the first portion 105a is installed at a height above the top of battery 130 and flush with display 104 and the second portion 105b is installed at a height below the top of the battery 130. The connector portion 105c traverses the height difference between the first portion 105a and the second portion 105b.

In FIGS. 2A-2C, embodiments of a bendable PCB configured as a MLB 105 are shown. For the purpose of illustration, the larger top surface area of the MLB 105 is shown as installed proximately parallel to the bottom surface of the device housing. In other embodiments, a bendable PCB can be installed such that the larger top surface area is proximately perpendicular to a bottom of the device housing (see FIG. 3A). In yet other embodiments, a first portion of a bendable PCB can be installed such that is parallel to the bottom surface of the housing and a second portion can be installed such that it is perpendicular to the bottom of housing. For example, in FIG. 2A, the portion 105a can be installed proximately parallel to the bottom of the housing and connector 105c can be bent through a right angle to allow connector 105b to be installed proximately perpendicular to a bottom surface of the housing. The perpendicular orientations are described for the purposes of illustration only. An angle at which each portion of a bendable PCB, such as MLB 105, is installed can vary and is not limited to installation in a perpendicular orientation relative to one another or relative to the various dimensions of the housing.

Figure 3A:
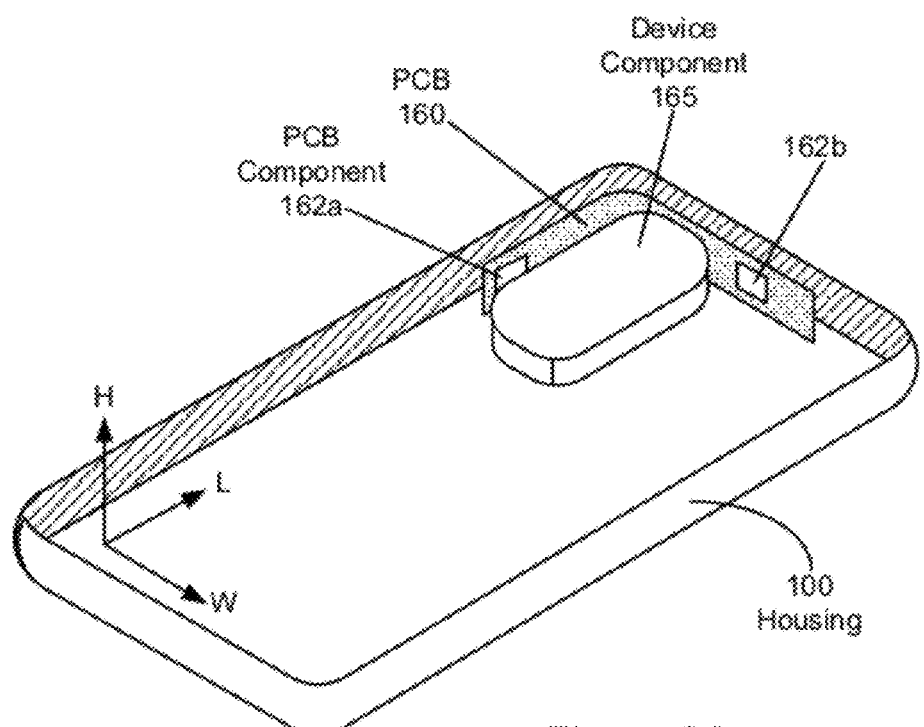
FIGS. 3A, 3B and 3C show a perspective view, a top view and a bottom view of a bendable PCB in accordance with the described embodiments.
Figure 3B:
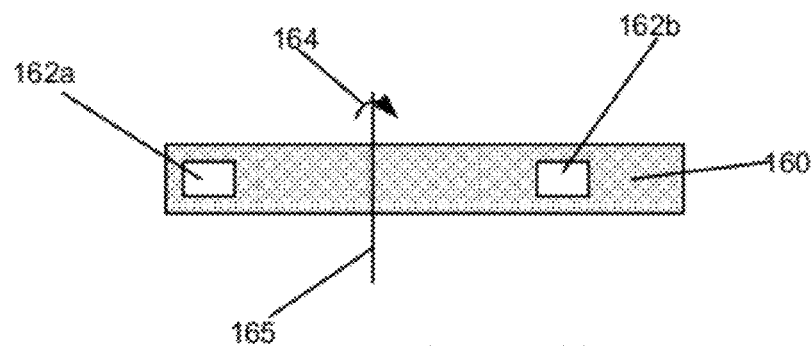
Figure 3C:
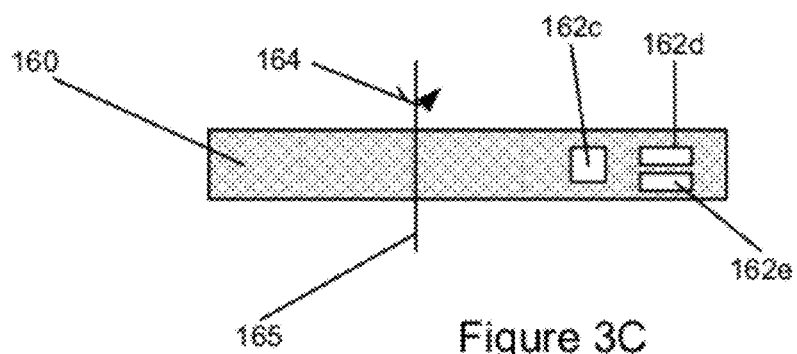

FIG. 3A shows a perspective view of a bendable PCB 160 installed in a configuration where the larger surface areas of the PCB are proximately perpendicular to the bottom of housing 100. In an unbent position, the PCB 160 is proximately a rectangular strip, which is shown for the purposes of illustration as other shapes can be utilized. A top and bottom view of the PCB 160 in an unbent position is shown in FIGS. 3B and 3C. In FIG. 3A, the PCB 160 is bent around a corner to fit in a space between the device component 165 and the housing 100. The device component 165 can be 1) structural in nature, such as part a frame for securing other internal components, 2) can be part of device component, such as a battery, that is installed in the housing or 3) combinations thereof.

During assembly, the PCB 160 can be provided as a flat strip and then can be bent and/or twisted to fit into a desired space, such as around the corner between the device component 165 and the housing 100. In one embodiment, the materials of the PCB 160 can be configured such that it does not hold its bent shape. Thus, the PCB 160 may have to be secured for it to remain in its bent position as shown in FIG. 3A.

As an example, to secure the PCB in a bent shape, the PCB 160 can be attached to the sides or bottom of housing 100 and/or the sides of device component 165. As another example, if the space where PCB 160 is placed is sufficiently narrow, such as the space between the device component 165 and the housing 100, then the PCB 160 can be bent and then slide into a desired space during the assembly. The bending moment stored in the PCB 160 (i.e., the PCB 160 will straighten if unconstrained), can force the PCB 160 against the sides of the space and can help to secure into the space in which it has been placed.

In another embodiment, during assembly, the PCB 160 can be provided as a flat strip. However, the PCB 160 can be configured such that it holds or partially holds a shape after bending. The PCB 160 can be configured such that can be more easily bent in particular regions, such as a region that is designed to be bent, and stiffer in other regions, such as a region that is designed to be flat. Details of forming a PCB, such as 160, with variable stiffness properties is described in more detail with respect to FIGS. 6A and 6B.

In yet another embodiment, the PCB 160 can be formed into its bent shape prior to assembly. For instance, the PCB 160 can be molded in a bent shape. In another example, the PCB 160 can be formed in a flat shape but then manipulated into a bent shape prior to assembly of the portable computing device. Then, a PCB 160 in a bent shape can be provided for the assembly process.

In various embodiments, the PCB 106 can include components that are attached to only a top side of the PCB 160, to only a bottom side of the PCB 160 or to both the top and bottom of the PCB 160. The attached components can extend above the surfaces of the PCB 160. The component locations can be selected according to the available spaces within the housing when the PCB 160 is in its installed position. Further, the component locations can be selected based upon where the intended bending locations are located on the PCB. In some embodiments, it can be desirable to attach certain components away from regions that are intended to be significantly bent because the bending can damage the component or its attachment to the PCB 160.

FIGS. 3B and 3C show a top and bottom view of PCB 160. In FIG. 3B, on the top of the PCB 160 components 162a and 162b are placed near the ends of the PCB 160. In one embodiment, the components can be placed away from the bending axis 165 where a bending direction is indicated by arrow 164 because a large amount of bending may damage a components attachment to the PCB 160.

The height clearances associated with each component attached to PCB 160, such as components 162a, 162b, 162c, 162d, and 162e, can vary from component to component. For instance, the component 162b can extend farther from the top of the board than component 162a. The height of each component affects the amount of clearance or space that is needed when the PCB 160 is installed. This height of each component can affect where each component is positioned on PCB 160. For example, when PCB 160 is in an installed position, component 162b is in a location where the PCB 160 extends away from the device component 165. The component 162b position on PCB 160 can have been selected so that it is located in this area away from device component 165 when it is installed because there can be more space available in this region than in the space between the device component 165 and the housing 100.

As described above, PCB 160 can include components on its top and bottom surfaces. The layout and number of components on each of the top and bottom surfaces can be different than one another. For instance, in FIG. 3B, on the top surface of PCB 160, two components are attached widely apart from one another. In FIG. 3C, three components, with sizes different from one another, are shown attached to a bottom surface of PCB 160 relatively close to one another as compared to the components shown in FIG. 3B.

FIGS. 4A-5E show top and side views of a bendable PCB 170 in various bend configurations. As described above, a bendable PCB, such as 170, can be formed in a bent configuration. For example, each of the configurations shown with respect to FIGS. 4A-5E can be formed in the bent configuration shown each of the figures. In alternative embodiments, the PCB 170 can be formed in an unbent configuration and then bent to another configuration before or during assembly. For example, the PCB 170 can be formed in either of the configurations shown in FIGS. 4B and 4C and then bent to the configuration shown in FIG. 4A. As another example, the PCB 170 can be formed in the configuration shown in FIG. 4A and then bent around axis 165 according to the direction 164 to achieve the configurations shown in FIGS. 4B and 4C, respectively.

A PCB, such as 170, can be configured to return to its original shape after bending or can be configured to maintain or partially maintain a particular bent configuration after bending takes place. At a particular location, a PCB, such as 170, can be bent through multiple axes. Also, a PCB can be bent and twisted at a particular location. In FIGS. 5D and 5E portions 170a and 170c are installed in a configuration at an angle to one another and at different heights, this installation configuration introduces a bend and a twist to portion 170b of PCB 170.

In other embodiments, a PCB, such as 170, can be bent in multiple locations. For instance, in FIG. 4A, each of portions 170a, 170b and 170c can be bent around a particular axis, in a particular direction and for a particular amount (e.g., each portion can be bent through a particular angle amount in a particular direction about an axis). As another example, in FIG. 4A, portion 170a, 170b and/or 170c can each be bent at multiple locations. For instance, portion 170b can be bent at two different locations. Thus, an assembly including an installation of a particular PCB 170 can include multiple different bending steps.

The bendable PCB 170 can be shaped and/or bent to fit in a space around a particular object. For instance, in FIG. 5A, a side view of an internal device component 176a is shown surrounded by PCB 170. The PCB 170 can be bent to proximately conform to a side perimeter of the component 176a. The side perimeter of component 176a can include straight line portions, stepped line portions or curved line portions. As shown in FIGS. 4B and 4C, the PCB 170 can be bent to fit around a curved surface, such as when device component 176a includes a curved side perimeter.

In FIG. 5B, a side view of a device component 176b is shown. The PCB 170 can be bent to fit around a top and bottom surface of component 176b. The component 176b can be irregularly shaped. For instance, component 176b includes two indentations. Board components 178a and 178b are placed at locations on a top surface of PCB 170 such that when the PCB 170 is bent around component 176b, the board components extend into the space provided by the indentations in the side profile of component 176b.

In FIG. 5C, a side view of a device component 176c and a side view of device component 180 are shown. In one embodiment, the device component 180 can be a structural component, such as an internal frame. PCB 170 can be bent around device component 176c and device component 180. Component 178a can be located on a top surface of PCB 170 and components 178b can be located on a bottom surface of PCB 170. The components 178a and 178b can be located to fit into spaces surrounding device components 176c and 180 that are created by their orientations.

The PCB 170 is shown bent such that a bottom surface of PCB 170 is proximately parallel to a side of device component 176c. In one embodiment, the bottom surface of PCB 170 can include a connector. The connector can be positioned on PCB 170 such that when the PCB 170 is bent in its installed configuration, the connector aligns with a connector on the side of device 176c allowing the two connectors to be joined. The two connectors can be joined in various ways. For instance, the two connectors can be configured to be snapped or to be soldered together.

Figure 6A:
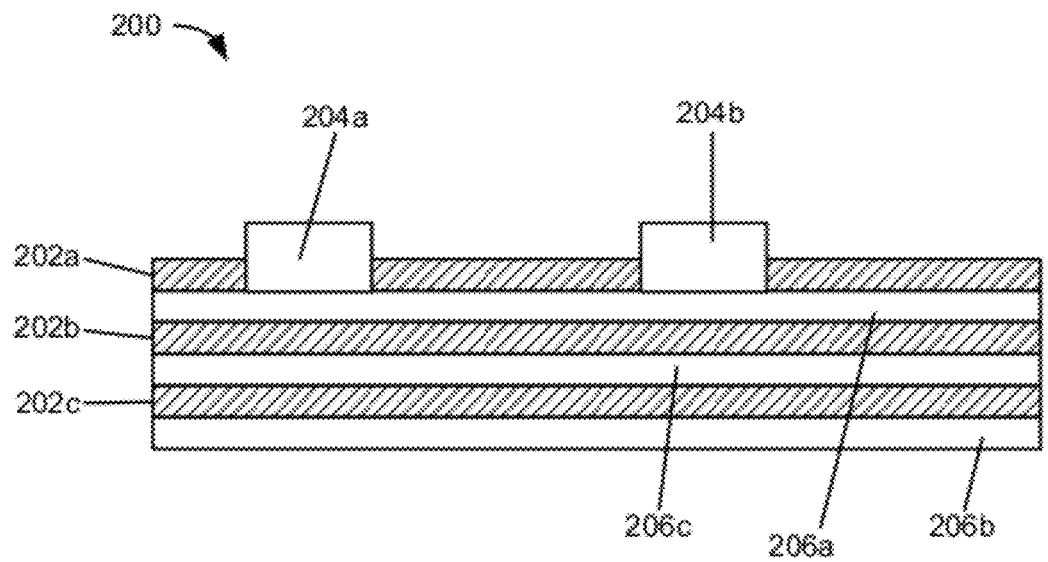
FIG. 6A shows a side cross section of a multi-layered PCB.

As previously described, bendable PCBs are provided. It can be desirable to configure the PCBs such that after bending, a bent shape is maintained. In general, it can be desirable to vary the stiffness properties associated with a bendable PCB. With respect to FIGS. 6A-6B, methods and PCB configurations are described that can be used to form PCBs with different stiffness properties. FIG. 6A shows a side cross section of a multi-layered PCB 200. The number of layers is provided for the purposes of illustration as more or less layers than shown can be utilized.

The PCB 200 can include a number of trace layers, such as 202a, 202b, 202c and a number of substrate layers, such as 206a, 206b and 206c. The trace layers can be used to form data and/or power connections to and between various PCB components, such as 204a and 204b. The PCB components, 204a and 204b are shown located on a top surface of PCB 200 but in other embodiments, components can also be located on a bottom surface of PCB 200.

The trace layers are typically formed from a conductive material such as copper. The trace layer can be formed as a solid layer, such as foil layer, and then a portion of the layer can be etched or milled away to form the traces that connect the various components.

The substrate layers can be formed from different materials depending on the insulating requirements of the particular circuits on the PCB board. A few examples of substrate materials that can be used are (Teflon), FR-4, FR-1, CEM-1 or CEM-3. The different layers can be laminated together with an epoxy resin prepeg. A few examples of prepeg materials that can be utilized include but are not limited to FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester). The The substrate and trace layers can be adjusted to affect their stiffness and flexibility. For instance, a trace layer or substrate layer can be made thicker or thinner to increase or decreased to make the multi-layered PCB stiffer or more flexible. Further, a substrate or trace layer material can be selected for its relative stiffness compared to other materials.

In one embodiment, a metal layer selected for its stiffness properties rather conductive properties can be substituted for a trace layer. The metal layer can be strong enough such that when the multi-layered PCB, such as 200, is bent, the PCB maintains the bent shape. One or more such layers can be used in a multi-layered PCB. In some embodiments, these "stiffening" layers may not include traces.

In a particular embodiment, a stiffening layer can be composed a shape memory alloy such as Nitinol. The shape memory alloy can be formed in a desired bent shape and then flattened and installed on a PCB, such as 200. The shape selected for the shape memory alloy layer can be a desired bent shape for the PCB, such as 200. Board components can be attached to the PCB 200 in its flattened position. Then, the shape memory allow can be manipulated to return it to the shape held in its memory. For instance, the shape memory can be heated. When the shape memory alloy returns to the position in its memory, the whole PCB can be bent into this configuration.

Figure 6B:
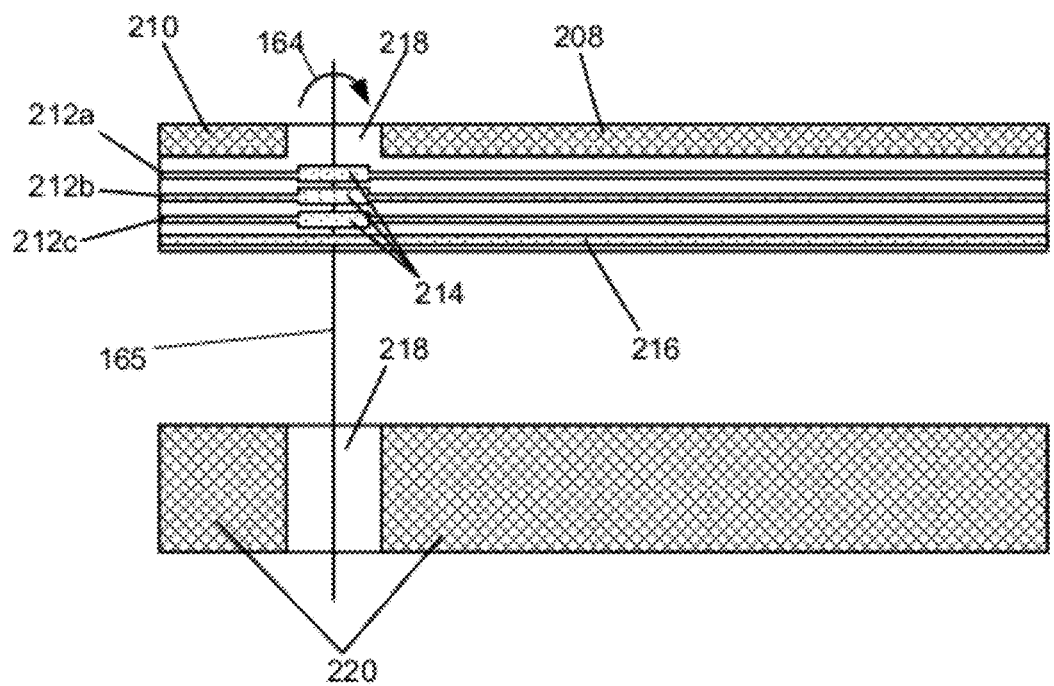
FIG. 6B shows top views of two trace layers in the multi-layered PCB of FIG. 6A.

FIG. 6B show top views of two trace layers, such as 202a, 202b or 202c, in the multi-layered PCB of FIG. 6A. A first trace layer includes 4 traces 212a, 212b, 212c and 216. The traces can be over a substrate 218. The PCB 200 is configured to be bent around axis 165 according to direction 164. In this region, traces 212a, 212b and 212c can have thickened portions 214 to resist damage that can result from bending. Trace 216 is already thick, so its size is not increased in the bend area proximate to axis 165.

Typically, excess material not used to form a trace is removed from the trace layer. In one embodiment, excess material can be left to stiffen the PCB in certain areas. For instance, excess material, such as 208 and 210, can be left to stiffen the PCB in these areas. In one embodiment, excess material is removed near the bend axis 165. The excess material can be removed to allow the PCB to be less stiff in this area and bend more easily.

Another trace layer is shown in FIG. 6B that includes no traces and just material 220. This material can be selected solely for its strength characteristics, such as its stiffness properties. A portion of the material is removed near the bend axis to allow the PCB to bend more easily in this area. In other embodiment, additional material can be added in this region rather than removed. The additional material can be added to allow the trace layer and hence the PCB hold a shape after it is bent around axis 165.

Figure 7:
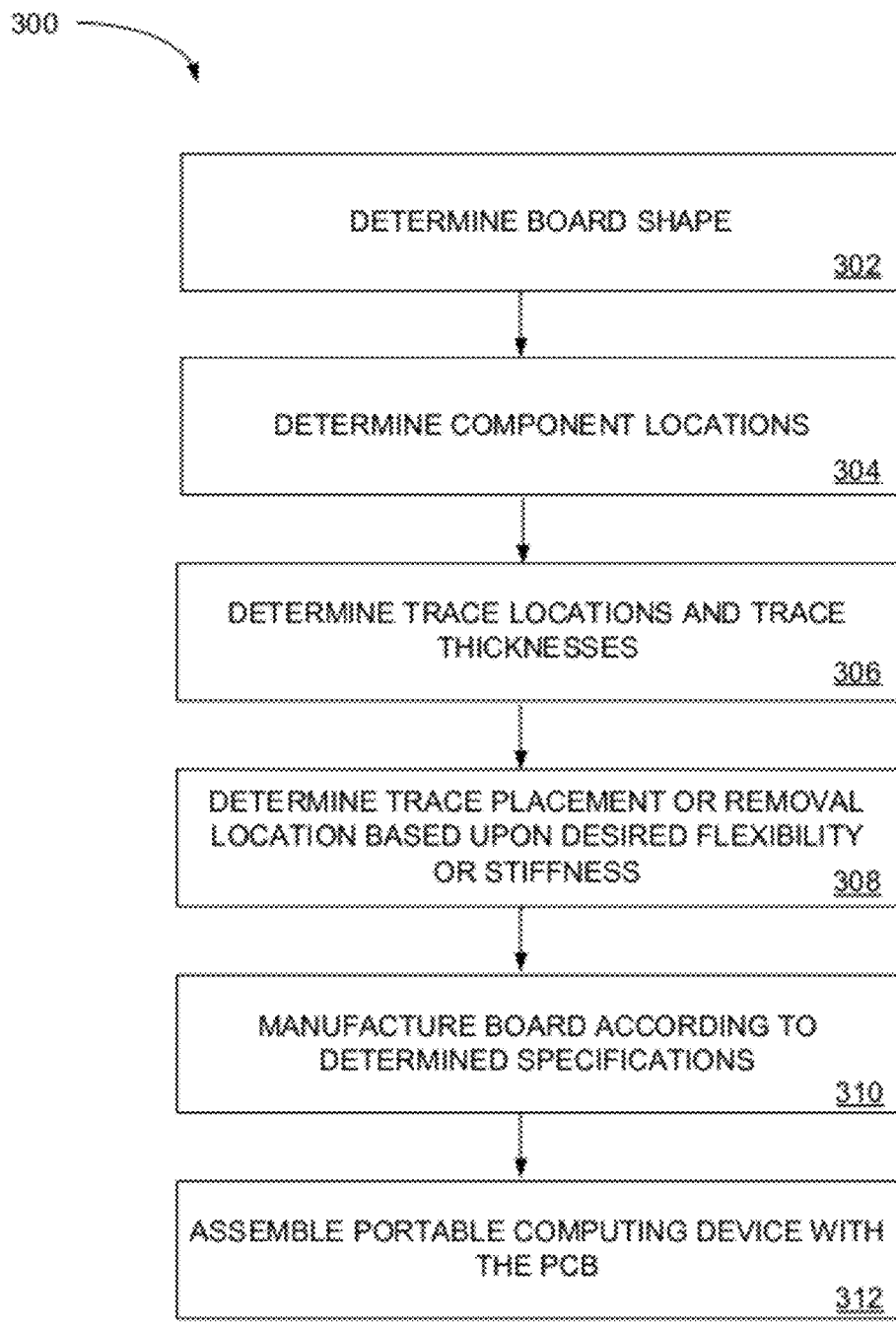
FIG. 7 is a flow chart of a method of manufacturing a portable computer device using a multi-layered PCB.

FIG. 7 is a flow chart of a method 300 of manufacturing a portable computer device using a multi-layered PCB. In 302, a board shape can be determined. The board can have different sized portions depending on the spaces in which each portion is intended to fit as well as whether each of the portions are to be bent and if so by how much. As previously described, the board can be formed flat or can be formed in a configuration that already includes bent portions.

In 304, component locations on a top and/or bottom surfaces of the board can be selected. The component locations can be selected based upon the available spaces around the board in its installed configuration. In 306, trace locations and trace locations for the board can be determined. The trace locations can be made thicker in locations where more board bending is expected.

In 308, board stiffness properties can be selected. Then, trace material in trace layers can left in certain areas or removed in certain areas to adjust the stiffness or flexibility characteristics of the board. Further, one or more layers can be dedicated towards adjusting the stiffness characteristics of the board. For example, a metal layer, selected for its strength, can be used to allow the board to hold a shape after it is bent.

In 310, the bendable PCB can be formed according to the specifications determined above. It can be formed in a flat shape or can be formed in a bent state. Various components can be attached to the PCB. In 312, a portable computing device can be assembled using a formed PCB. The assembly process can involve installing the formed PCB in a bent configuration. The formed PCB can be bent one or more times during the assembly process.

In particular embodiments, the portable computing can be assembled using a computer aided manufacturing and assembly process. The computer aided manufacturing and assembly process can involve the use of multiple devices, such as multiple devices configured in an assembly line configuration. For instance, in 310, in a first computer aided assembly process multiple devices can be programmed to form the bendable PC according to the specifications determined in 302-308. The first computer aided assembly process can involve programming different devices to form and/or cut board substrates in a particular shape and lay down particular trace patterns that can vary from substrate layer to substrate layer on the PCB. Another computer aided and manufacturing process could involve devices, such as robotic assemblers, that can be programmed to assemble the portable computing device. The robotic assemblers can be programmed to move the PCB through one or more bend configurations during the assembly of the portable computing device.

Figure 8:
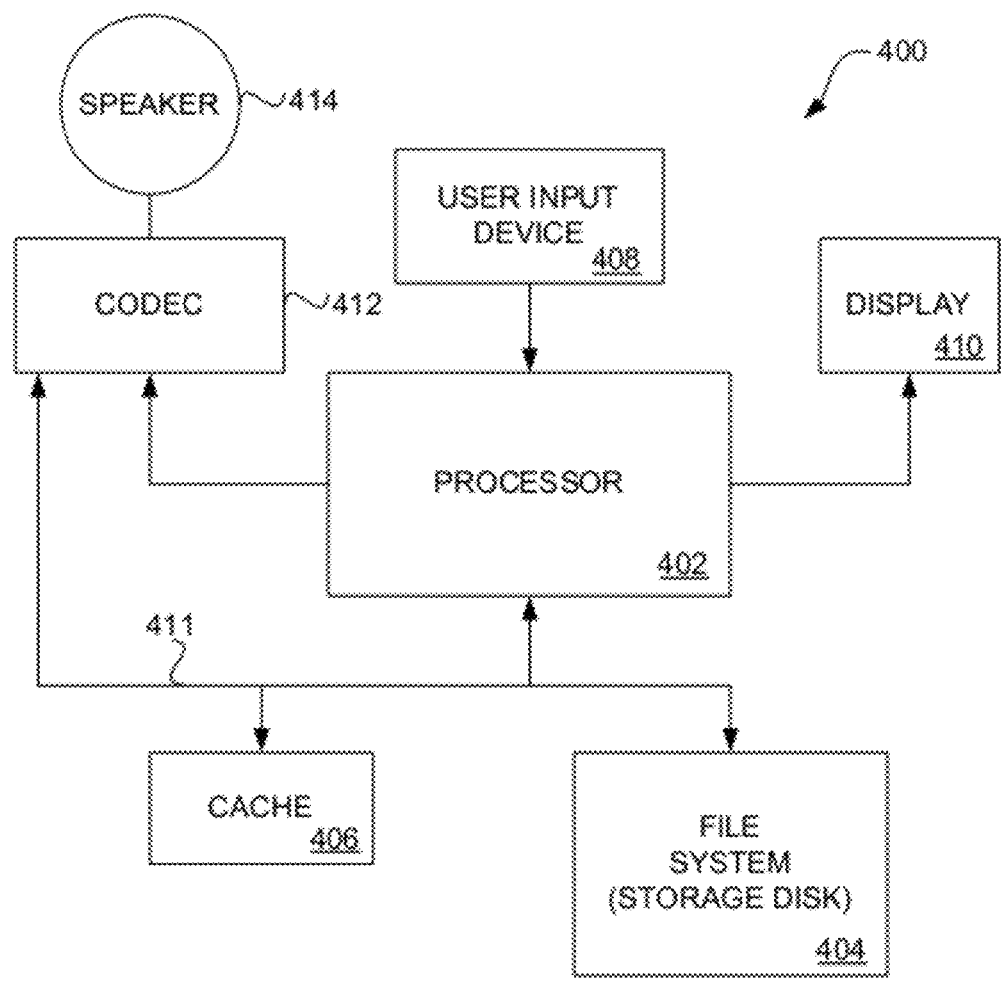
FIG. 8 is a block diagram of portable computing device with media playing capabilities in accordance with the described embodiments.

FIG. 8 is a block diagram of a media player 400 in accordance with the described embodiments. The media player 400 includes a processor 402 that pertains to a microprocessor or controller for controlling the overall operation of the media player 400. The media player 400 stores media data pertaining to media items in a file system 404 and a cache 406. The file system 404 is, typically, a storage disk or a plurality of disks. The file system typically provides high capacity storage capability for the media player 400. However, since the access time to the file system 404 is relatively slow, the media player 400 also includes a cache 406. The cache 406 is, for example, Random-Access Memory (RAM) provided by semiconductor memory. The relative access time to the cache 406 is substantially shorter than for the file system 404. However, the cache 406 does not have the large storage capacity of the file system 404.

Further, the file system 404, when active, consumes more power than does the cache 406. The power consumption is particularly important when the media player 400 is a portable media player that is powered by a battery (not shown).

The media player 400 also includes a user input device 408 that allows a user of the media player 400 to interact with the media player 400. For example, the user input device 408 can take a variety of forms, such as a button, keypad, dial, etc. Still further, the media player 400 includes a display 410 (screen display) that can be controlled by the processor 402 to display information to the user. A data bus 111 can facilitate data transfer between at least the file system 404, the cache 406, the processor 402, and the CODEC 412.

In one embodiment, the media player 400 serves to store a plurality of media items (e.g., songs) in the file system 404. When a user desires to have the media player play a particular media item, a list of available media items is displayed on the display 410. Then, using the user input device 408, a user can select one of the available media items. The processor 402, upon receiving a selection of a particular media item, supplies the media data (e.g., audio file) for the particular media item to a coder/decoder (CODEC) 412. The CODEC 412 then produces analog output signals for a speaker 414. The speaker 414 can be a speaker internal to the media player 400 or external to the media player 100. For example, headphones or earphones that connect to the media player 400 would be considered an external speaker.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A portable electronic device comprising:
   an enclosure;
   a battery installed within the enclosure;
   a number of device components installed within the enclosure; and
   a main logic board, including a processor and a memory, formed on a contiguous multi-layered printed circuit board, configured to receive power from the battery and control the portable electronic device, the printed circuit board comprising:
      a first custom shaped portion configured to fit in a first space between the battery and the number of device components including the processor;
      a second custom shaped portion configured to fit in a second space between the battery and the number of device components including circuitry for operating the portable electronic device; and
      a thin and narrow third portion installed in a pathway between the number of device components and the battery that connects the first space and the second space wherein the thin and narrow shaped portion only includes traces for providing data or power connections between the first custom shaped portion and the second custom shaped portion.

2. The portable electronic device of claim 1, wherein the first custom shaped portion or the second custom shaped portion are rectangular shaped.

3. The portable electronic device of claim 1, wherein the first custom shaped portion or the second custom shaped portion includes one or more curved portions.

4. The portable electronic device of claim 1, wherein the first custom shaped portion and the second custom shaped portion are installed at an angle relative to one another.

5. The portable electronic device of claim 1, wherein the first custom shaped portion and the second custom shaped portion are installed at different heights relative to one another.

6. The portable electronic device of claim 1, wherein the pathway between the first space and the second space includes one or more steps or curves and the third portion is bent to follow the one or more steps or the curves.

7. A portable electronic device comprising:
   a housing;
   a battery installed within the housing;
   first and second device components installed within the housing; and
   a printed circuit board configured to receive power from the battery, comprising:
      a processor and a memory attached to the printed circuit board,
      a first region configured for alignment with a top end of the battery,
      a second region configured for alignment with a bottom end of the battery, and
      a third region that extends between the first region and the second region, configured to conform proximately to one side of the battery such that the first region, the second region, and the third region partially surround the battery.

8. The portable electronic device of claim 7, wherein the printed circuit board is installed in the housing such that the first region is secured at a height within the housing that is different from a height at which the second region is installed.

9. The portable electronic device of claim 7, wherein the first device component is attached to the first region.

10. The portable electronic device of claim 9, wherein the second device component is attached to the second region.

11. The portable electronic device of claim 10, wherein the third region includes a number of traces coupled between the first component and the second component.

12. The portable electronic device of claim 7, wherein the printed circuit board includes a trace layer having at least one conductive trace and stiffening material.

13. The portable electronic device of claim 7, wherein the printed circuit board includes a metal layer formed from a material selected to increase the stiffness of the printed circuit board, wherein said metal layer is free of traces.

14. A portable electronic device comprising:
   an enclosure;
   a battery installed within the enclosure;
   an electronic component installed within the enclosure; and
   a contiguous printed circuit board having a first portion and a second portion, wherein the printed circuit board is bent so that the electronic component is interposed between the first portion and the second portion; and
   a plurality of additional electronic components attached to the printed circuit board.

15. The portable electronic device defined in claim 14 wherein the printed circuit board further comprises:
   a substrate layer;
   a trace layer; and
   a metal layer.

16. The portable electronic device defined in claim 15 wherein the metal layer is configured to stiffen the printed circuit board such that the printed circuit board remains in a bent configuration.

17. The portable electronic device defined in claim 14, wherein the plurality of additional electronic components are attached to a common surface of the printed circuit board.

18. The portable electronic device of claim 14, wherein at least one of the plurality of additional electronic components is attached to a first surface of the printed circuit board and at least one of the plurality of additional electronic components is attached to an opposing second surface of the printed circuit board.

19. The portable electronic device of claim 14, wherein the electronic component has a curved portion and wherein a portion of the printed circuit board is bent to follow a curvature of the curved portion.

20. The portable electronic device of claim 14, wherein the printed circuit board is bent in multiple locations.

21. The portable electronic device of claim 14, wherein the printed circuit board comprises a metal layer that is formed from a shape memory alloy, wherein the shape memory alloy is formed in a shape that corresponds to the bent shape of the printed circuit board.

* * * * *